United States Patent [19]
Jacobson et al.

[11] Patent Number: 5,999,014
[45] Date of Patent: Dec. 7, 1999

[54] METHOD FOR CONCURRENTLY PROGRAMMING OR ACCESSING A PLURALITY OF IN-SYSTEM-PROGRAMMABLE LOGIC DEVICES

[75] Inventors: Neil G. Jacobson, Mountain View; Matthew T. Murphy, San Jose, both of Calif.

[73] Assignee: Xilinx, Inc., San Jose, Calif.

[21] Appl. No.: 08/932,307

[22] Filed: Sep. 17, 1997

[51] Int. Cl.[6] ............................ G06F 7/38; H03K 19/173; H03K 19/177
[52] U.S. Cl. .................................................. 326/38; 326/39
[58] Field of Search ............................ 714/17, 724, 725; 711/173, 103; 712/37; 326/38, 41, 39; 710/129; 395/595

[56] References Cited

U.S. PATENT DOCUMENTS

| | | | |
|---|---|---|---|
| 4,153,941 | 5/1979 | Caddell ..................................... | 395/595 |
| 4,914,574 | 4/1990 | Terada et al. ............................ | 710/129 |
| 5,543,730 | 8/1996 | Cliff et al. ................................ | 326/38 |
| 5,635,855 | 6/1997 | Tang ......................................... | 326/364 |
| 5,650,734 | 7/1997 | Chu et al. ................................. | 326/38 |

OTHER PUBLICATIONS

"IEEE Standard 1149.1 and 1a entitled IEEE Standard Test Access Port and Boundary–Scan Architecture", published Oct. 21, 1993 by *The Institute of Electrical and Electronics Engineers, Inc.*, under ISBN 1–55937–350–4,345 East 47th Street, New York, NY 10017–2394, chapter 1, pp. 1–2 and chapter 3, pp. 1–6, and chapter 5, pp. 5–16.

*Primary Examiner*—Michael Tokar
*Assistant Examiner*—Patrick Wamsley
*Attorney, Agent, or Firm*—Edel M. Young; Philip M. Shaw, Jr.

[57] ABSTRACT

An improved method for concurrently programming in-system programmable logic devices (PLDs). More specifically, where within a plurality of serially connected PLDs, there are devices having different numbers of programmable memory cells, and devices whose memory cells require different wait periods to carry out programming, the method herein provides more optimum time efficiency and uses significantly less time overall for programming, erasing or reading back the PLDs. Also, the invention accommodates the implementation of retries to assure complete programming or erasing even when the initial attempt is not entirely successful. The method provides steps for accommodating PLDs with different wait times by bypassing fully programmed devices and speeding up programming times after smaller and slower devices are programmed and larger and faster devices are still not fully programmed. The method employs the step of altering the program implementation from concurrent to sequential programming to optimize retry efficiency.

12 Claims, 8 Drawing Sheets

FIG. 1
PRIOR ART

FIG. 2 TAP Controller State Diagram
Prior Art

METHOD FOR CONCURRENTLY PROGRAMMING OR ACCESSING A PLURALITY OF IN-SYSTEM-PROGRAMMABLE LOGIC DEVICES

FIELD OF THE INVENTION

The present invention relates generally to the field of programmable logic devices and more particularly to an improved method for concurrently effecting operations on a plurality of in-system programmable complex programmable logic devices (CPLDs).

BACKGROUND OF THE INVENTION

IEEE Standard 1149.1 and 1a entitled IEEE Standard Test Access Port and Boundary-Scan Architecture, published Oct. 21, 1993 by the IEEE under ISBN 1-55937-350-4 relates to circuitry that may be built into an IC device to assist in testing the device as well as testing the printed circuit board in which the device is placed. In particular, the standard provides for testing IC devices connected in series (commonly referred to as a daisy chain).

Figure 1:
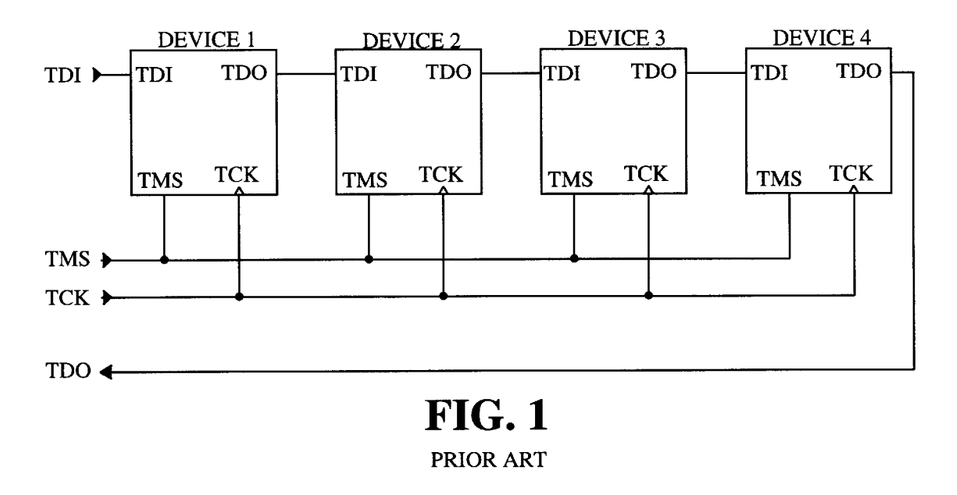
FIG. 1 shows the prior art interconnection structure for an IEEE Standard 1149.1 test access port (TAP) architecture.

FIG. 1 shows a structure comprising three devices, controlled by four signals, a test data input signal TDI applied to the first device, a test data output signal applied by the first device to the second device and chained through the other devices, a test mode select signal TMS, and a test clock signal TCK. This structure complies with IEEE Standard 1149.1. A data output port TDO from one device is connected to the data input port TDI of the next device to create the daisy chain. All data and instructions for all devices are loaded into the data input port of the first device in the chain.

Figure 2:
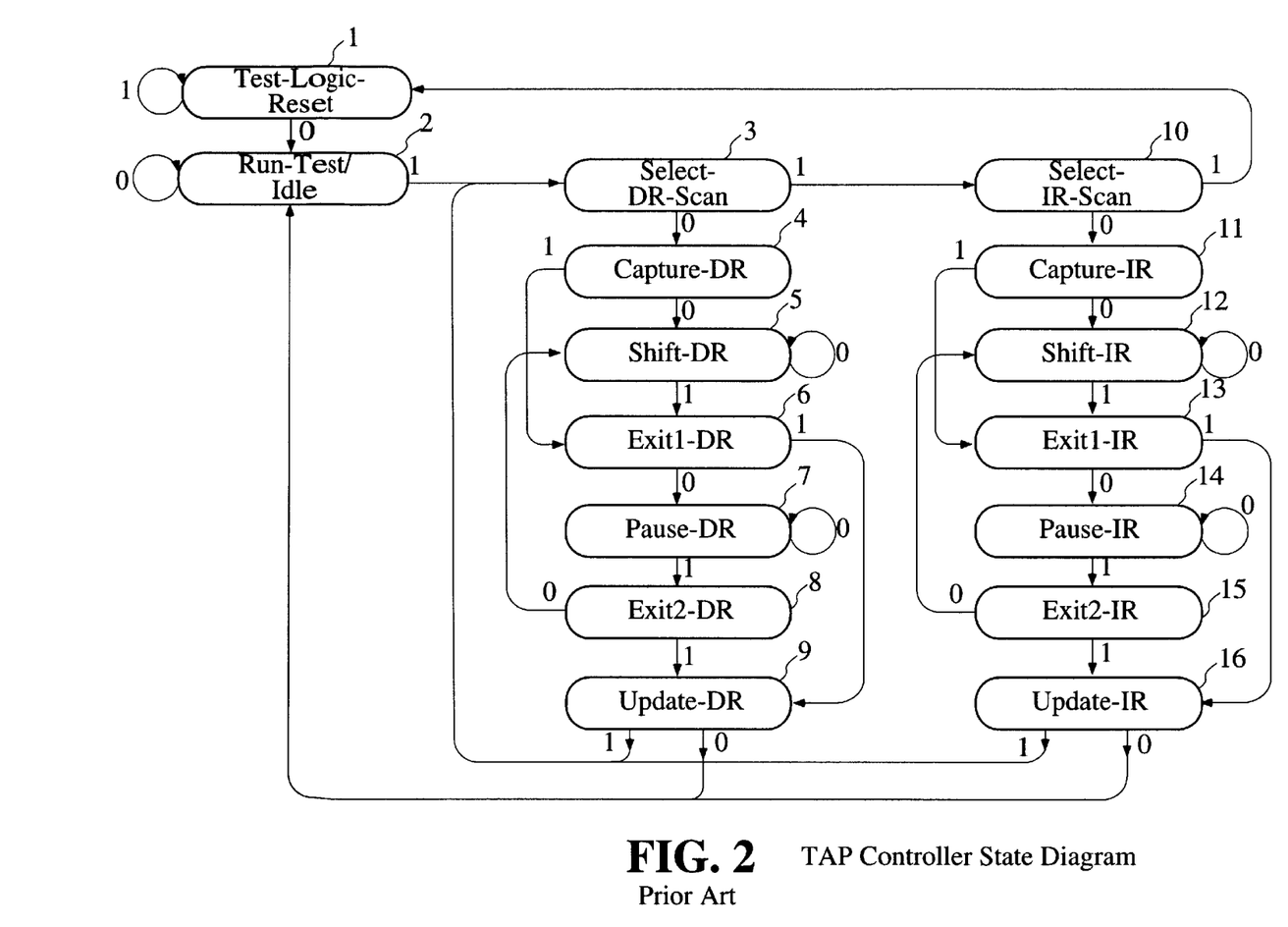
FIG. 2 shows the TAP controller state machine controlled by TMS and TCK signals according to the IEEE Standard 1149.1.

The test mode select signal TMS and the clock signal TCK control a 16-state state machine shown in FIG. 2 that is within the IC device, which meets IEEE Standard 1149.1, and controls shifting in of the data. On each rising edge of clock signal CLK, the state of test mode select signal TMS is inspected by a state machine within the IC device. (Such state machines are well known and are not discussed here.) FIG. 2 shows movement through the states based on the TMS signal at the rising edge of CLK. As shown in FIG. 2, five consecutive high (logic 1) TMS signals place the state machine into STATE 1, the Test-Logic Reset state. From there, a single low signal or a continuous low signal places the state machine into STATE 2, the Run-Test Idle state in which no action occurs but from which action can be initiated more quickly.

Loading Data Register

From STATE 2, a single logic 1 moves the state machine to STATE 3, the Select-DR-Scan state, which is a path select state from which loading of data registers can be initiated. One logic 0 signal initiates STATE 4, from which initializing data are loaded in parallel from an internal register. Next, a logic 0 signal initiates STATE 5, the Shift-DR state, which is held by logic 1 TMS signals while serial data are shifted into a shift register or registers. After serial shifting of data, a logic 1 followed by logic 0 causes a pause at STATE 7. Another 10 returns to STATE 5 for more loading of serial data. Following STATE 5 or STATE 7, two logic 1's initiate STATE 9 in which the appropriate data registers are actually updated. While the state machine is in STATE 9, data that have been shifted into the IC are latched into the data registers on the falling edge of TCK. From here continuous high signals return the state machine to STATE 1, the Test-Logic Reset state, and continuous low signals return to STATE 2, the Run-Test Idle state.

Loading Instruction Register

From STATE 2, two logic 1 signals prepare for capturing instructions into the instruction register by moving the state machine to STATE 10, the Select-IR-Scan state. A logic 0 then initiates STATE 11, the Capture-IR state, and a logic 0 then initiates STATE 12 in which instruction data are shifted into the instruction register while the TMS signal remains at logic 0. State 14 allows for a pause in the shifting of instructions into the instruction register, and STATE 16 causes the actual latching of the instructions into the instruction register, on the falling edge of TCK. Once the new instruction has been latched, it becomes the current instruction.

The state machine of FIG. 2 is further described at pages 5-1 through 5-16 of IEEE Standard. 1149.1, which information is incorporated herein by reference.

Programming, Erasing or Reading Back of PLDs

Some CPLD devices are programmed by a nonvolatile means such as EPROM cells or flash cells (transistors). Generally, these devices can be programmed using the IEEE standard discussed above. The programming step involves raising voltages at certain transistor gates to a high level and maintaining the high level until sufficient charge has flowed onto or away from a floating gate of the transistor to cause the transistor to maintain a certain state when the high voltage is removed. Typically, a stream of data from ten to several hundred bits long can be shifted into several devices in less time than is required to program a transistor (cell) in a device. Thus a practical and widely used programming procedure is to serially shift an instruction and then a unit of programming data through a daisy chain of devices (STATEs 5 and 12 of FIG. 2) and then move into a programming mode (usually occurs in STATE 2 of FIG. 2 when entered from STATE 9 or STATE 16) during which all addressed EPROM, EEPROM, or flash transistors (cells) are programmed simultaneously as specified by the programming data. This method is practical and efficient when all devices in the daisy chain are the same size and have the same requirements for programming time and programming voltage. However, the devices are often unequal in size.

One prior art method for programming a daisy chain of devices having unequal size is disclosed in U.S. Pat. No. 5,635,855 to Tang. Tang discloses a method for simultaneously programming a plurality of in-system programmable devices connected in series. If three devices are to be programmed and the three are of unequal size, Tang teaches a method by which all three devices are programmed simultaneously until the first is done, and the remainder continue until they are also done (see Tang FIG. 9). Such a method can be used to significantly reduce the programming, erase and readback times as compared to accessing each device in sequence, especially for a large number of devices. Tang's method is satisfactory when all such devices have programmable cells which are accessed (programmed, erased, or read back) in about the same amount of access time and which are substantially free of programming omissions or otherwise do not require retries. However, Tang's method is not compatible with IEEE Standard 1149.1 and also is not the optimum method when the devices have unequal access times (wait periods). The wait period is the time that it normally takes a programmable device to respond to programming data by altering its cell states (for programming and erase operations) or indicating its cell states (for a read back operation) and then generating an output signal indicating completion of that process. Since the wait period is typically much longer than the time required to input programming data, the wait period for a device is the principal factor in the overall time required to program a device.

Typically, devices having larger numbers of programmable cells can generate programming voltages more quickly and therefore have shorter wait periods for programming a cell or set of cells than devices having smaller numbers of programmable cells because of the internal cell overhead. Thus, a large device that is, say, eight times as large as a smaller device will not take eight times as long to program.

If the programming of all devices is done based upon the longest wait period, the time needed to program all of the devices is made longer than necessary. However, if a shorter wait period is used, programming of devices with the longer wait times will not be performed properly. Thus there is a need to provide an improvement which accommodates serially connected devices having different wait periods and cell numbers while simultaneously reducing the overall time of programming the devices.

Another factor that should be accounted for is the time required to reprogram devices that did not successfully program the first time. The method of Tang is also not optimum when there is at least a substantial likelihood that programming of some programmable cells will have to be retried. While most EPROM technologies comprise devices which are always successfully programmed or erased in one attempt (unless the device is faulty), some memory cell technologies such as flash technology occasionally require retries before programming or erasure is fully completed. Cells that need to be retried are typically many orders of magnitude fewer in number than the entire number of programmable cells. Thus there is also a need to provide an improvement which accommodates retries in an efficient manner where the memory cell technology is likely to require some retries.

SUMMARY OF THE INVENTION

The present invention comprises an improved method for concurrently accessing in-system programmable logic devices (PLDS) for program, erasure or readback. Also, the present inventive method accommodates retries to assure completion of programming even when the initial attempt is not entirely successful.

According to the invention, where there are devices having different numbers of programmable memory cells, and whose memory cells require different wait periods to carry out programming, the method herein provides for programming only the devices requiring programming at the rate required by the slowest of the devices requiring programming.

For example, if a system includes three devices to be programmed, a fast large device and two slower but smaller devices, a serial bit stream of, say, 16 bits is loaded, 8 bits into the fast large device and 4 bits into each of the smaller devices- Programming continues for the wait time required by the slowest device. Status data are then taken from the three devices, and if programming is successful another round of shifting and programming takes place. When the smaller devices are finished, the programming rate increases to that allowed by the larger faster device until that device is finished. If a programming cycle indicates that the slower devices were successfully programmed but the large fast device was not satisfactorily programmed, a retry cycle can be initiated in which the large fast device is programmed alone and at a faster rate. By increasing the programming rate when the slowest device needing programming has become faster, as well as bypassing fully programmed devices or devices not needing a retry, significant time is saved. As used herein, the term "bypass" includes all ways of bypassing a part in accordance with IEEE Standard 1149.1.

It may be more advantageous to perform retries in a sequential manner than in a concurrent manner while performing the original programming process in a concurrent manner. The method of the present invention also comprises steps for recognizing and retrying the programming of those few memory cells in respective devices which are not successfully programmed during the initial programming. The method employs the step of altering the program implementation from concurrent to sequential programming to optimize retry efficiency.

For the purpose of this description, only programming operation is described. However, it will be understood that erase and readback operations are substantially identical. The term "access" is used herein to apply to program, erase, and readback functions.

DETAILED DESCRIPTION OF A PREFERRED EMBODIMENT

Figure 3:
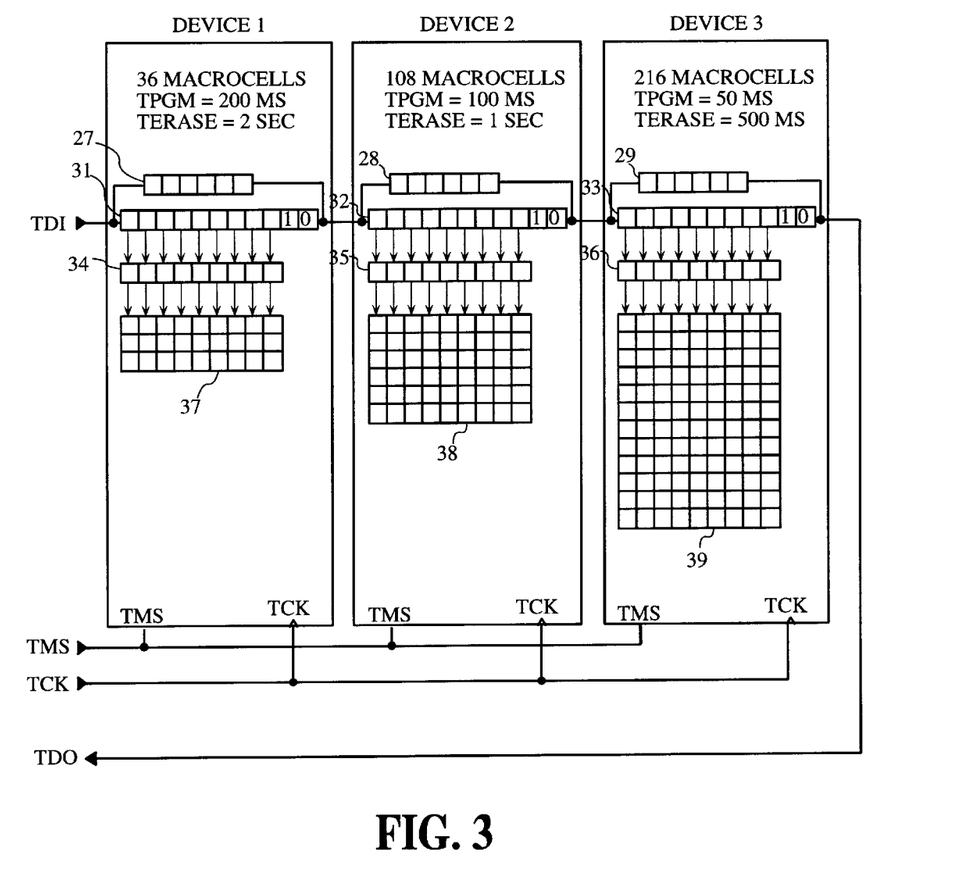
FIG. 3 is a block diagram of an illustrative serially interconnected PLD chain with which the present invention may be used.

FIG. 3 illustrates a three PLD configuration wherein DEVICE 1 comprises 36 macrocells having a programming time TPGM=200 ms. where TPGM is the time required to program one address location. DEVICE 2 has 108 macrocells and a TPGM=100 ms. DEVICE 3 has 216 macrocells and a TPGM=50 ms. The number of macrocells defines the logic capacity of the PLD, and for PLDs the number of programmable address locations is directly proportional to the number of macrocells. FIG. 3 also indicates that the respective erase times (TERASE), that is, the time required to erase one sector or block of macrocells is smaller for the larger devices.

The devices of FIG. 3 are interconnected for use of the standard interface and protocol in accordance with IEEE Standard 1149.1 and 1a. As seen in FIG. 3, the devices are connected in series to receive input serial data signals TDI for loading programming data and to provide output serial data signals TDO for reading back programmed data. In addition, the devices are connected for parallel input of clock signals TCK and mode select signals TMS. Of course, it will be understood that the circuit of FIG. 3 is provided for illustrative purposes. Many other such circuits and combinations of devices also make use of the present invention. A block of serial data are shifted in at terminal TDI. For example, while the state machine controlled by test mode signal TMS is in STATE 12 (FIG. 2), six bits of instruction data for each device, or 18 bits, are shifted through instruction registers 27, 28, and 29 in the three devices DEVICE 1, DEVICE 2, and DEVICE 3 under control of clock signal TCK. In STATE 11, an initialization pattern is loaded into instruction registers 27, 28, and 29. Then in STATE 12 as instructions are shifted in on line TDI, the initialization pattern is shifted out on line TDO. This pattern is used to confirm that DEVICE1, DEVICE2, and DEVICE3 are operating properly. Then TMS updates the instruction register (in STATE 16, FIG. 2) and transitions the state machine to Shift-DR STATE 5 at which time programming data bits are shifted into data registers 31, 32, and 33 of each of the three devices. FIG. 3 shows that 9 programming bits and two status bits are shifted into data registers 31, 32, and 33 of each device. In other systems other numbers of bits may be shifted in, depending upon the needs of the devices. The number of bits need not be the same for all devices. TMS transitions the state machine to STATE 2 and the 27 programming bits are programmed into addressed locations in each of the three devices.

Since DEVICE 1 is the slowest of the three and requires 200 ms to program, programming occurs for 200 ms. In a system in which TCK can not be stopped during programming, TMS transitions to STATE 2 and remains there for the number of cycles of TCK needed to do the programming. In a system in which TCK may be stopped, TMS may leave the state machine in STATE 9 while programming occurs, after which clock TCK is restarted. Then TMS transitions the state machine back to STATE 12, and then STATE 5, where shifting again occurs. In STATE 5, both 33 bits of new data and status information and 33 bits of programmed data and status information are shifted, the new data and status information coming in on line TDI and the programmed data and status information being shifted out on line TDO. FIG. 3 will be further discussed below in connection with the discussion of FIG. 8.

The improved method of the invention shall now be described in conjunction with the flow charts of FIGS. 4 through 6.

Shifting Instructions through Daisy Chain

Figure 4:
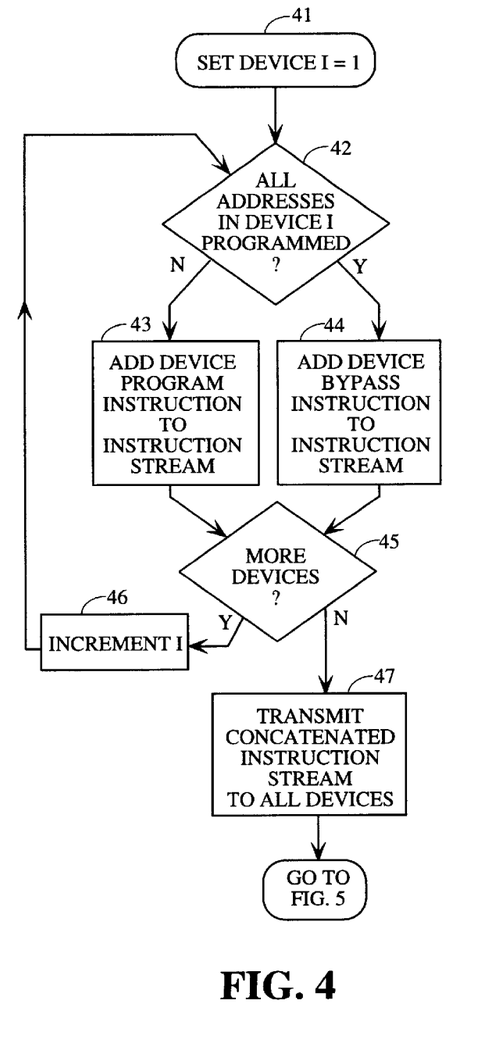
FIG. 4 is a flow chart illustrating steps for applying configuration data to the daisy chain of PLDs.

FIG. 4 shows the flow for forming the instruction stream to be loaded through the daisy chain on lines TDI and TDO (FIG. 3) and loading the instruction stream into the devices. In FIG. 4, the instruction stream is formed and transmitted to all devices. In the present example, the devices each receive six instruction bits at a time. Instructions control whether the devices are to be programmed, read from, erased, or bypassed, and also control test operations as defined by IEEE Standard 1149.1.

As shown in FIG. 4, the initial step 42 in shifting instruction data for either program, erase or read output is determining whether or not the active address space for device I has been exhausted. If it has not been exhausted, at step 43 the device access instruction is added to the current instruction stream. If it has been exhausted, at step 44 the device bypass instruction is added to the current instruction stream. By incrementing I at step 46, this step of adding bits to the instruction stream is repeated for all of the interconnected devices until step 45 indicates there are no more devices. Then at step 47 the concatenated instruction stream is transmitted to all devices. For the example of FIG. 3, when the process begins and all devices are being loaded, 18 instruction bits are applied to TDI and shifted into position in the three devices.

Shifting Programming Data through Daisy Chain

After instructions have been shifted into position in the instruction registers of the three devices, a data loading mode occurs for loading data and programming a current address in the device.

Figure 5:
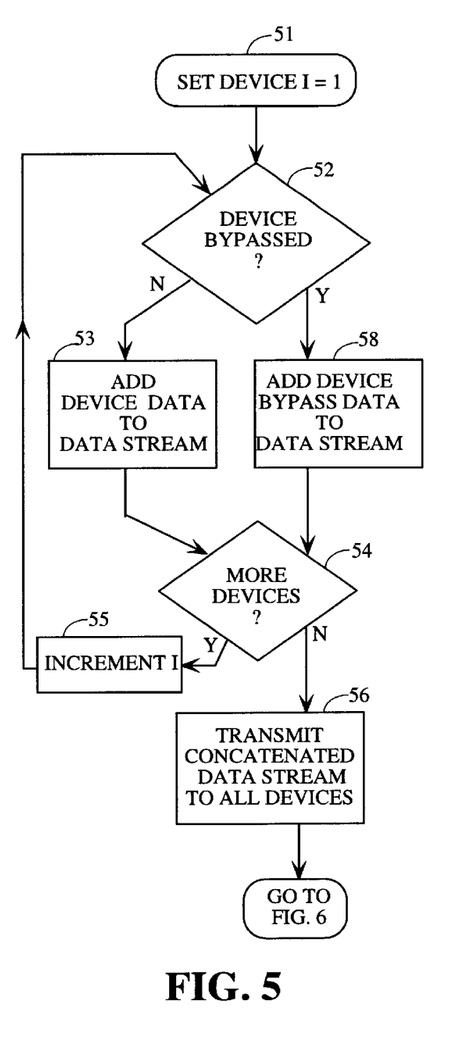
FIG. 5 is a flow chart illustrating steps for determining current wait time and programming the PLDs.

FIG. 5 shows steps for shifting data into the devices. As with FIG. 4, the first step 52 is to determine whether all addresses in DEVICE 1 have been programmed by checking whether the device is bypassed. If not, at step 53 device data are added to the data stream and the next device is (steps 54, 55). If yes, at step 58 device bypass data are added to the data stream and the next device is checked (steps 54, 55). After step 54 indicates all devices for which an address is unprogrammed have had data added to the data stream, at step 56 the data are transmitted through the three devices so that they can be programmed. Recall that if some devices have been completely programmed, as shown in FIG. 4, a bypass instruction will have been added to the instruction stream. Only one bit of bypass data need be added to the data stream for devices that are fully programmed. As data are being loaded into one address, data are being shifted out from a previous address. In one preferred embodiment, the first two bits of data shifted in for each device identify whether the input data are to be operated on, and the first two bits shifted out are status bits that indicate whether programming was successful for the previous data. In other embodiments, status bits may not be included, or may be used for other purposes. In the present example, the 33 bits shifted out include 6 bits that indicate whether the previous instruction data were satisfactorily programmed into the three devices.

Programming

Figure 6:
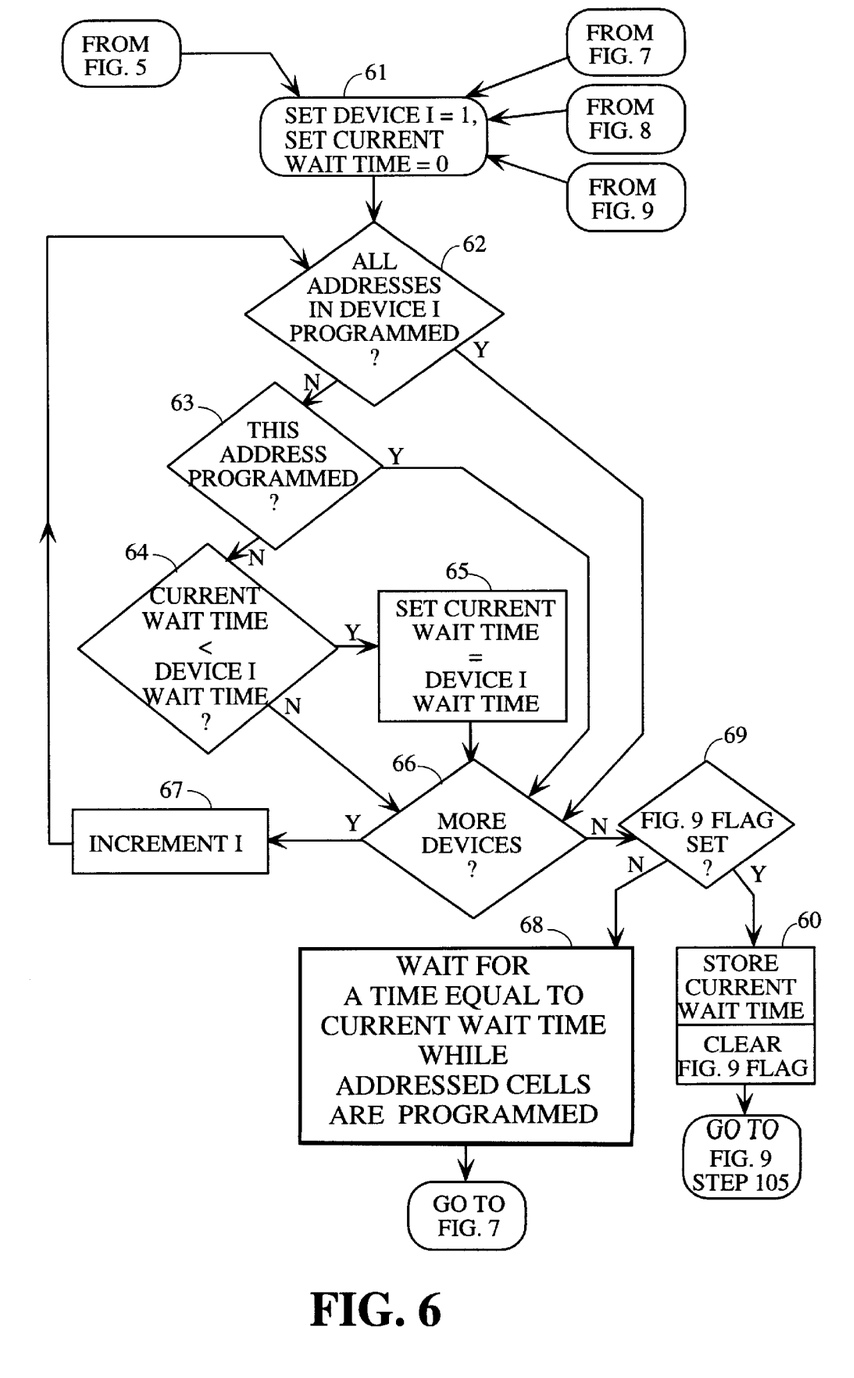
FIG. 6 is a flow chart illustrating steps for minimizing wait time.

As shown in FIG. 6, a programming step occurs next. Another step in the improved inventive method of the present invention is determining and applying programming voltages for an appropriate wait time. Programming is accomplished by the following steps. First, at step 61 it is assumed that the initial condition is a zero wait time for device I=1. In step 62, if the address space for I=1 is not yet exhausted, and if in step 63 the current address has not yet been successfully programmed, at step 64, the current wait time will be compared to the 200 ms wait time of DEVICE 1. The current wait time (i.e. 0) will, of course, be less than the DEVICE 1 wait time so that at step 65, the current wait time will be set equal to the DEVICE 1 wait time of 200 ms. By cycling through steps 66 and 67 as necessary, wait times of the other devices with unexhausted address space are then compared. At step 68, after there are no more devices for wait times to be examined and assuming no flag was detected in step 69, the process stops and waits for a time equal to the finally determined wait time while the addressed cells are programmed. In this manner, the wait time for N devices will always be set to the longest wait time of the N devices which still have unexhausted address space. Thus the improved method of the present invention provides the shortest possible wait times during the entire programming process even as the smaller and slower devices become fully programmed. Step 60 will be discussed in connection with FIG. 9.

Checking Programming and Retrying

Figure 8:
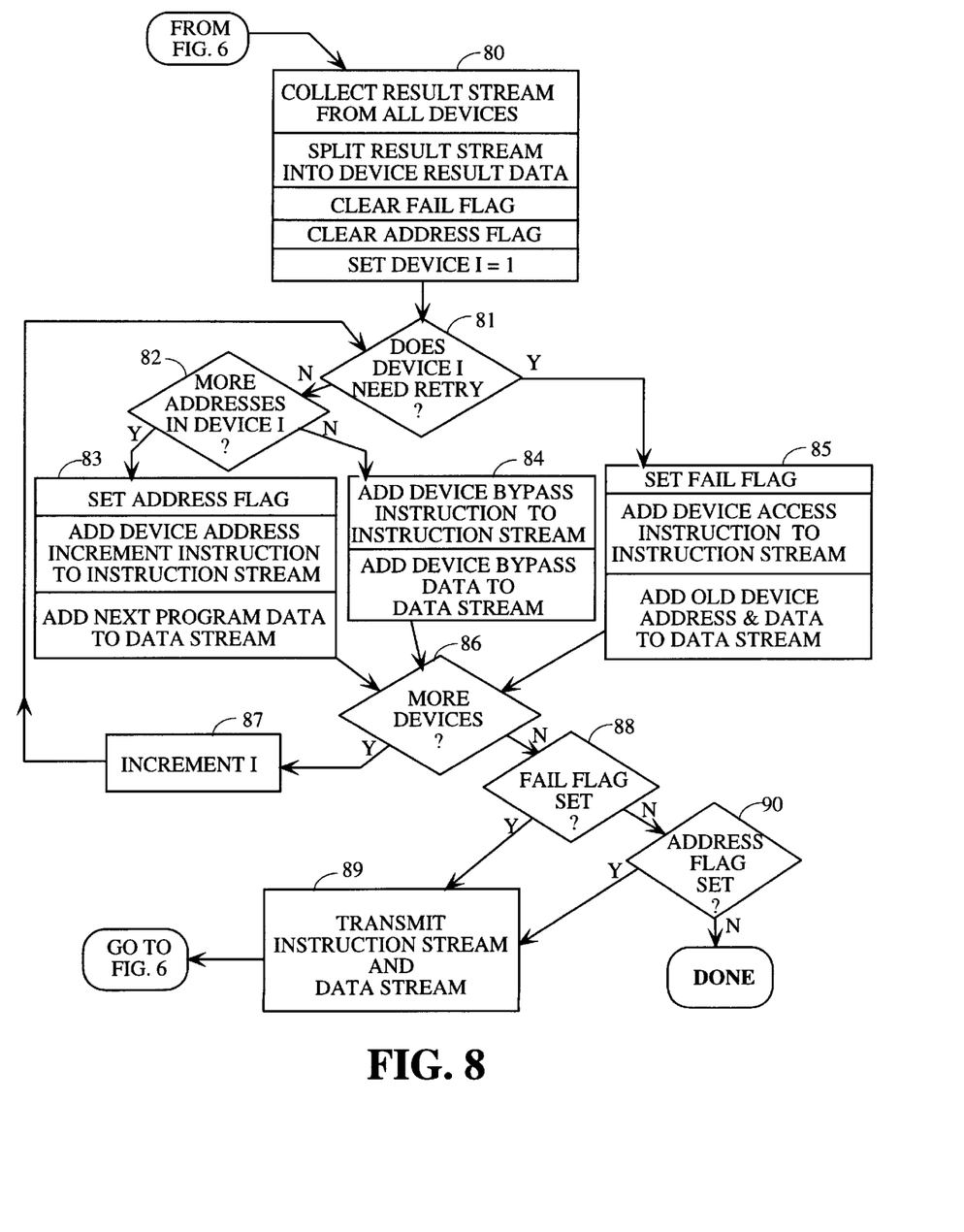
FIG. 8 illustrates another set of steps for collecting device responses and retrying directly after programming.
Figure 9:
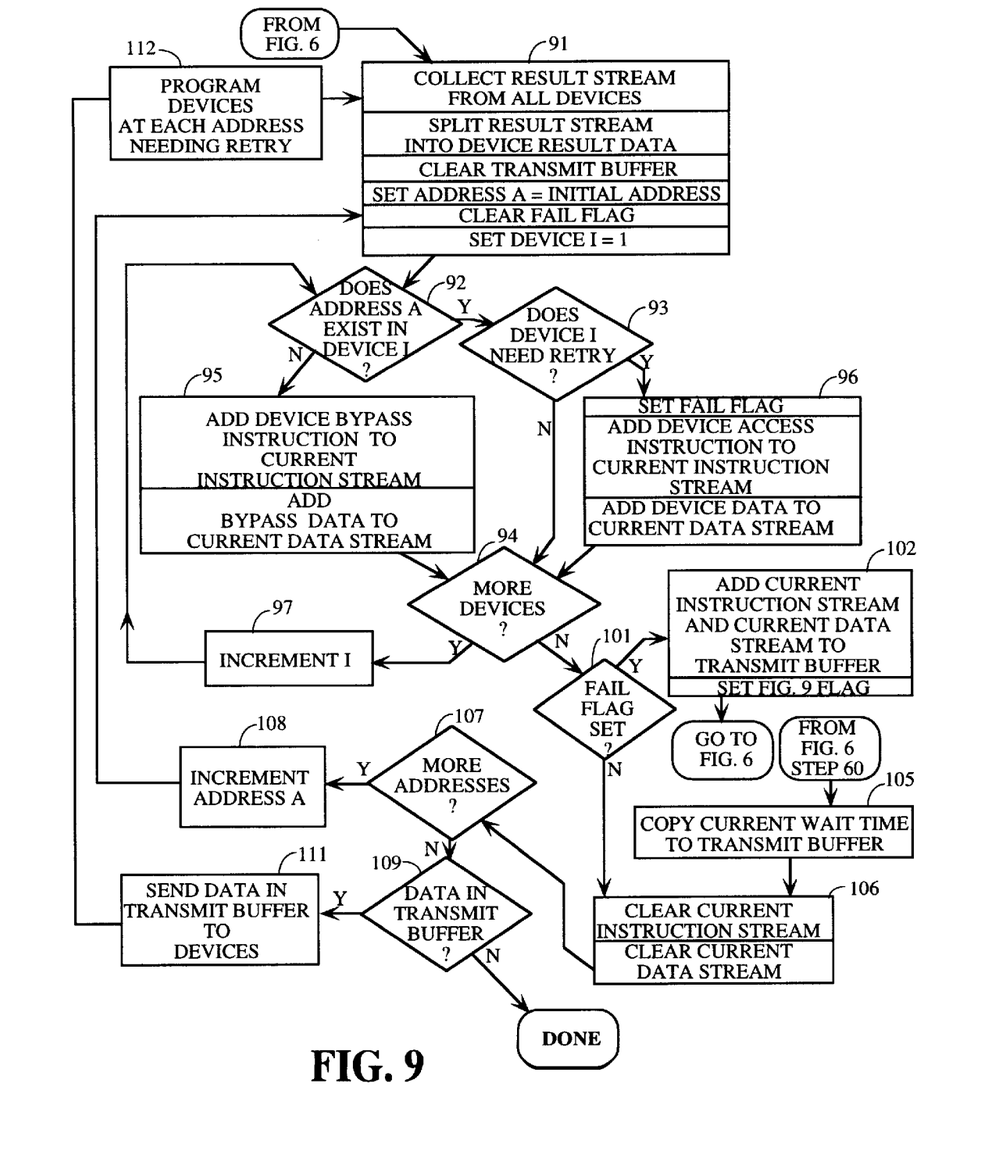
FIG. 9 illustrates yet another set of steps for collecting device responses as all cells are receiving an initial programming operation, and afterwards retrying as necessary.

Next, a retry process may occur, and this may occur in several ways described in connection with FIGS. 7, 8, and 9. FIG. 6 shows a final step "GO TO FIG. 7". If the process of FIG. 8 is to be used, this final step will read "GO TO FIG. 8". If the process of FIG. 9 is to be used, this final step will read "GO TO FIG. 9".

Figure 7:
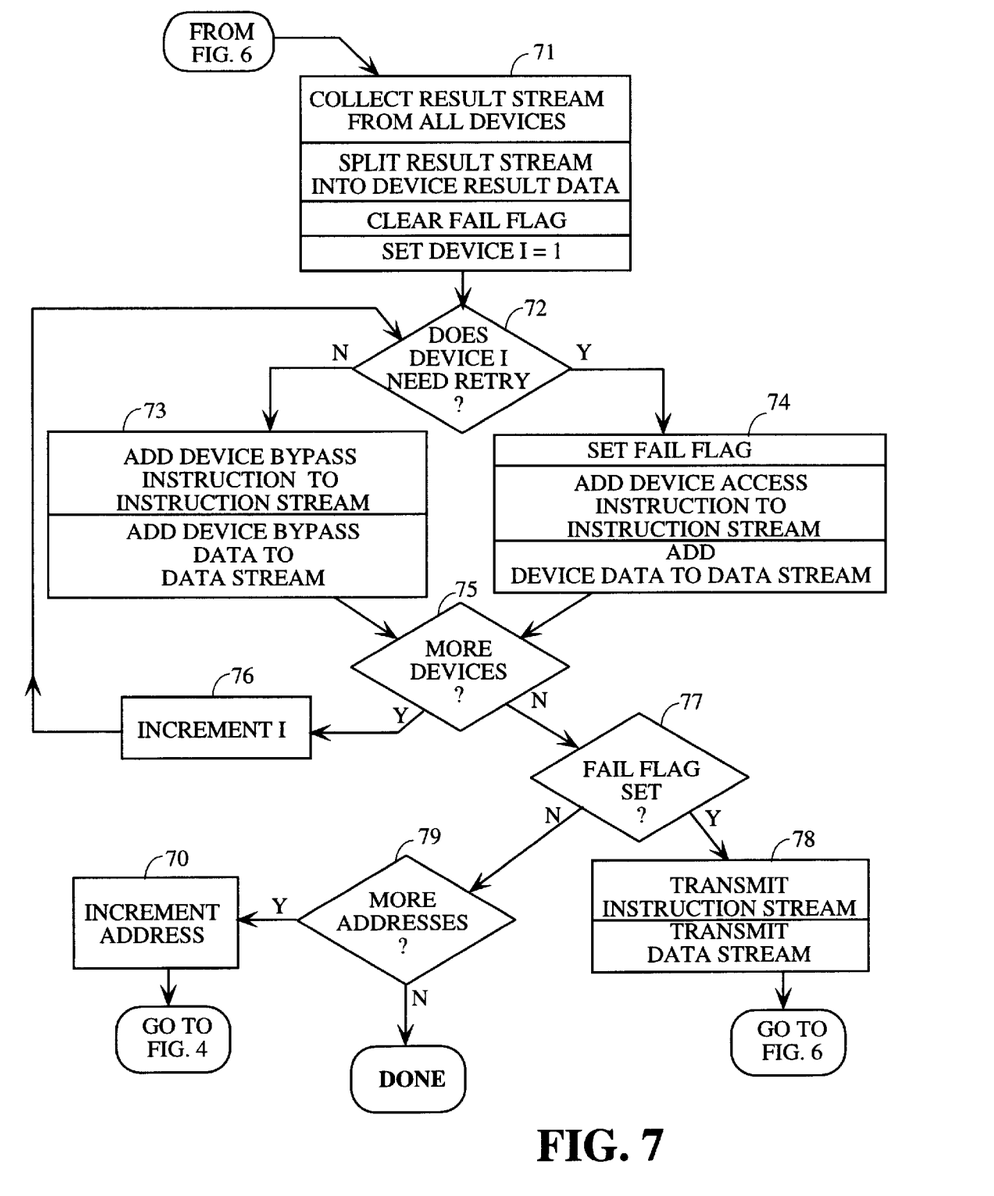
FIG. 7 is a flow chart illustrating steps for collecting device responses and retrying unprogrammed cells directly after programming.

If only one address is used to address all devices, the process in FIG. 7 may be used. The process of FIG. 7 retries unsuccessfully programmed memory cells directly after the failure is detected. If device addresses can be incremented separately, the process in FIG. 8 may be used. The process of FIG. 8 also retries directly after a failure is noted. Alternatively, a list of addresses needing retries may be stored and all retries may occur after an initial pass at programming is completed, as shown in FIG. 9.

In FIG. 7, successfully programmed devices are bypassed during a retry. The process of FIG. 7 reprograms data for each address as the need arises.

In FIG. 7, as data are being shifted in for one set of addresses (discussed above in connection with FIG. 5), at step 71 the result stream for the previous address is collected from all of the devices. The result stream is then split into individual device result data. To keep up with success of the programming step, a FAIL flag is cleared to 0 as an initial condition. Thereafter, in sequence, at step 72 each device's result data is analyzed to determine whether the device needs any retries. If it does, at step 74 the FAIL flag is set to 1 and that device is accessed and the retry data concatenated into the data stream. If a device does not require a retry, at step 73 a bypass instruction is added to the instruction stream and one bit of bypass data is added to the data stream. As indicated at steps 75 and 76, the process is repeated for each device. Once these steps are completed for all of the interconnected devices, at step 77 the FAIL flag is checked. If the previous programming step was successful, and at step 79 more addresses are indicated, at step 70 the address is incremented and the process returns to FIG. 4 where the next set of addresses are programmed. If step 77 shows the FAIL flag is set, showing that any devices failed in the previous programming step, at step 78, the instructions and data are transmitted. The procedure then moves to FIG. 6 where a retry occurs, each of the devices requiring retry data receiving data sequentially and each of the devices not requiring retry data being bypassed. Completion of a retry according to the steps in FIG. 6 returns the process to FIG. 7 and the data are again tested and retried if necessary. When all programming is successful for the current address, the FAIL flag will not be set, and at step 70 the process will move to the next address and return to steps shown in FIG. 4. Finally when step 79 shows the last address has been successfully programmed, the process is DONE, as shown in FIG. 7. FIG. 8 shows another process for handling retries when it is possible to control the incrementing of each address separately. In this process, the successfully programmed devices have their addresses incremented and receive new data while the devices needing retries have their addresses held at the former value and the old data are resent and reprogrammed. In FIG. 8 as in FIG. 7, at step 80, the data stream is read back from all devices and split into result data for each of the devices, and the FAIL flag is cleared. Additionally, an address flag is cleared, this address flag keeping up with whether all addresses in a device have been successfully programmed. As in FIG. 7, the first device is selected. And as in FIG. 7, at step 81, the device data are checked to see if the device needs to be retried. But unlike FIG. 7, if device I does not need retry, the process moves to step 82, which determines whether there are more addresses in that device. If so, at step 83, the address flag is set, an instruction is added to the instruction stream to increment the address for that device, and new data are added to the data stream. Thus a device with a successfully programmed address does not have to wait while a device with an unsuccessfully programmed address is retried. If at step 82 there are no more addresses in DEVICE I, at step 84, a device bypass instruction is added to the instruction stream, and a bit of bypass data is added to the data stream. If step 81 indicates device I does need a retry, the process moves to step 85 where the FAIL flag is set, a device access instruction is added to the instruction stream, and the old device address and data are added to the data stream.

In other embodiments, the resending of data for a retry is avoided, the data being held in a shadow register in the device. Such an embodiment is illustrated in FIG. 3 where registers 31, 32, and 33 are shift registers which load data in parallel into shadow registers 34, 35, and 36, where data are held for programming an addressed portion of memory cell arrays 37, 38, and 39. In these embodiments using shadow registers, time is saved since the data stream is shortened during retry. In one of these embodiments, the first two data bits in the data stream are status bits. The value "10" in these two bits indicates that the data to follow are to be loaded into the shadow registers 34, 35, and 36 for subsequent programming of the nonvolatile memory cells in memory cell arrays 37, 38, and 39, thereby erasing previous data in the shadow registers 34, 35, and 36. According to one implementation of the shadow register embodiment, an indication that a retry is needed simply causes shift registers 31, 32, and 33 to shift data one bit, moving the value "1" into the first bit of the data stream, thus indicating that these data are not to be shifted into the shadow registers, thereby retaining old data in the shadow registers for a retry at programming the addressed memory cells of memory cell arrays 37, 38, and 39.

In this embodiment, the success of programming is determined by performing XOR functions of data in shadow registers 34, 35, and 36 and the addressed cells of memory cell arrays 37, 38, and 39. Success causes the first two status bits to be set to "11". Reading out this "11" data while the next data are being read in causes the "10" in the next data being read in to remain in place so that on a next clock cycle they are moved to the shadow registers as addresses are updated, and when the process again reaches step 68 of FIG. 6, the next addressed memory cells are subsequently programmed. The feedback data are thus the originally read-in data bits and the updated status bits. In FIG. 3, a successful programming operation would change the two status bits illustrated as "10" to "11" before read back. When many devices have been connected into a daisy chain, the feature of shifting data by one bit to indicate the need for a retry saves considerable time.

Returning to FIG. 8, at step 86, a test is made for whether more devices are in the chain. If so, at step 87 the device index is incremented at step 87 and the process returns to step 81. If step 86 determines all devices in the chain have been tested to see if a retry is needed, at step 88 a check is made of the fail flag to see whether any of the addresses just checked needed a retry. If so, at step 89, the instruction stream and data stream are transmitted through the daisy chain into the devices. The process returns to FIG. 6 where the minimum acceptable programming time is determined and the retry is made. The process then returns to FIG. 8 with updated addresses for each device and the process of FIG. 8 is repeated. Finally, when all addresses have been tested and all retries have been successful, step 88 will indicate that the fail flag is not set and step 90 will determine if the address flag is set. If it is, the process proceeds to step 89. If the address flag is not set, the process is DONE.

FIG. 9 illustrates yet another retry process. As before, the process begins with initialization steps 91 in which the result stream is collected from all devices as it shifts out on line TDO. And as before, the result stream is split into result data for the various devices. Next, a transmit buffer for accumulating data to be retransmitted is cleared, and an ADDRESS A for the retransmitted data is set to the initial address. As before, a fail flag is cleared and the device index is set to the first device.

At step 92, a test is made for whether ADDRESS A exists in DEVICE I. Of course the first address will exist in all devices, so the process moves to step 93 where the current device is tested to determine whether programming was successful or a retry is needed. If not, the process moves to step 94 where a determination is made whether there are more devices to be tested in that address set. If so, at step 97 the device index is incremented and the process returns to step 92 where the next device is tested to determine if that address exists in the device. If not, the process moves to step 95 where a bypass instruction is added to the retry instruction stream and a bit of bypass data is added to the retry data stream. The process continues at step 94.

In step 93, if any device is found to need a retry, the process moves to step 96, where the fail flag is set, an access instruction is added to the instruction stream of the retry, and data for the device's current address are added to the transmit buffer. The process moves to step 94 and is repeated for all devices at that address.

After all devices have been tested at that address, the process moves to step 101 where the fail flag is tested. If no devices are found to need retries, the fail flag will not be set and the process will move to step 106 where the instruction stream is cleared and not added to the transmit buffer. However, if a retry was needed, the fail flag will be set and the process moves to step 102 in which instruction and data are added to the transmit buffer for the retry operation. As part of step 102 in FIG. 9, a flag is set so that only part of the process in FIG. 6 can be used.

The process then returns to FIG. 6. When a set of devices for one address is completed in FIG. 6, the process moves to step 69 where the FIG. 9 flag is recognized to be set. At step 60, the current wait time determined in step 65 is stored, the FIG. 9 flag, is cleared, and the process returns to step 105 in FIG. 9.

In FIG. 9, at step 105, this wait time is then copied to the transmit buffer and the process moves to step 106 where the instruction and data streams are cleared and the process moves to step 107 where the next address is tested via step 108. Finally when all addresses have received an initial programming effort, step 107 will indicate that there are no more addresses, and the process will move to step 109.

If any retries have been needed, there will be data in the transmit buffer at step 108, and at step 111 this data will be sent to the devices. For each address, the transmit buffer will include information on the length of time that programming must occur. Thus for each address, programming occurs at step 112, before the process returns to step 91. Recall that each address must be programmed for the length of time needed by the slowest device at the current address that needs to be retried. Thus in FIG. 2, the state machine will pause at STATE 2 for the specified length of time to accomplish programming at that address. Finally, if step 109 in the process of FIG. 9 indicates that no retries were necessary, programming is DONE.

Thus it will be understood that the present invention comprises an improved method for programming a plurality of in-system PLDs, the improvements relating to minimizing the time required to complete the programming of such devices wherein the devices have unequal numbers of memory cells and to enabling retries in the programming process.

Those having skill in the art of PLDs, will now perceive various additions and modifications which may be made to the inventive method disclosed herein. By way of example, there is a measure of concurrency that can be exploited in the steps of FIGS. 5, 6, and 7 in that results which are collected during the steps of FIG. 4 can be processed during the steps of FIG. 7 to further minimize the overall programming time. Accordingly, all such additions and modifications are deemed to be within the scope of the invention which is to be limited only by the appended claims and their equivalents.

Of course, although the detailed discussion focuses on programming of devices, the same procedures are also used for erasing devices and reading back of information when programming is not occurring.

We claim:

1. A method for concurrently accessing a plurality of in-system logic devices, comprising:
   (a) determining the longest wait time of all of the devices having unexhausted address space;
   (b) applying the longest wait time as the current wait time in programming the devices; and
   (c) repeating steps (a) and (b) until all of the devices are fully programmed.

2. A method for concurrently accessing a plurality of in-system logic devices, comprising:
   (a) determining the longest wait time of all of the devices having unexhausted address space;
   (b) applying the longest wait time as the current wait time in programming the devices;
   (c) reseating steps (a) and (b) until all of the devices are fully programmed; and
   wherein step (a) is carried out by comparing the current wait time with each device wait time, in sequence, of all those devices still having unexhausted address space and determining whether or not the current wait time is less than the device wait time.

3. The method recited in claim 2 wherein step (b) is carried out by setting the current wait time to a device wait time if and only if the current wait time is less than the device wait time.

4. The method recited in claim 2, further comprising the steps of:
   (d) collecting a result stream from all of the devices;
   (e) splitting the result stream into individual device result data;
   (c) determining from the result data which of the devices need programming retries;
   (f) concatenating bypass instructions to transmit to devices which do not need retries; and (g) concatenating device access instructions and device data to transmit to devices which do need retries.

5. A method for concurrently retrying programming of a plurality of in-system logic devices, comprising the steps of:
   (a) collecting a result stream from all of the devices;
   (b) splitting the result stream into individual device result data;
   (c) determining from the result data which of the devices need programming retries;
   (d) concatenating bypass instructions to transmit to devices which do not need retries; and
   (e) concatenating device access instructions and device data to transmit to devices which do need retries.

6. A method of accessing a plurality of IC devices connected in series comprising the steps of:
   (a) for each device, determining whether all addresses have been accessed;
   (b) for devices not fully accessed, adding device access instructions to an instruction stream;
   (c) for devices fully accessed, adding device bypass instructions to the instruction stream;
   (d) transmitting the instruction stream through all devices;
   (e) transmitting a data stream through all devices;
   (f) determining the smallest adequate wait time for all devices to be accessed;
   (g) accessing said devices for said smallest adequate wait time.

7. The method of claim 6 further comprising the step of:
   (h) testing said devices for adequate accessing; and
   (i) retrying only failed devices.

8. A method for retrying the accessing of nonvolatile memory cells comprising the steps of:
   (a) shifting accessing information through shift registers in a plurality of IC devices, said accessing information including at least two input status bits having two different values;
   (b) testing a previously shifted set of accessing information for successful accessing;
   (c) if accessing is successful, replacing said status bits with output status bits to indicate successful accessing;
   (d) if accessing is unsuccessful, replacing said status bits with output status bits to indicate unsuccessful accessing;
   (e) if said output status bits indicate successful accessing, allowing said accessing information to be shifted into shadow registers;
   (f) if said output status bits indicate unsuccessful accessing, shifting said accessing information including said input status bits by one bit, thereby changing the pattern of said status bits and causing said accessing information not to be shifted into said shadow registers and retaining old accessing information in said shadow registers for retrying an accessing operation.

9. A method of accessing a plurality of IC devices, each device having a different wait time, connected in series comprising the steps of:
   (a) for each device, determining whether all addresses have been accessed;
   (b) for devices not fully accessed, adding device access instructions to an instruction stream;
   (c) for devices fully accessed, adding device bypass instructions to the instruction stream;
   (d) transmitting the instruction stream through all devices;
   (e) transmitting a data stream through all devices;
   (f) determining the smallest adequate wait time for all devices to be accessed by comparing a current wait time with wait times of all those devices still having unexhausted address space, and setting the current wait time to a device's wait time if the current wait time is less than the device's wait time;
   (g) accessing the devices for the smallest adequate wait time.

10. The method of claim 8 further comprising the step of:
    (h) testing the devices for adequate accessing; and
    (i) retrying only failed devices.

11. A method for concurrently accessing a plurality of in-system logic devices for programming, comprising:
    (a) determining the longest wait time of all of the devices having unexhausted address space;
    (b) applying the longest wait time as the current wait time in programming the devices; and
    (c) repeating steps (a) and (b) until all of the devices are fully programmed.

12. The method recited in claim 11, wherein the in-system logic devices include program logic devices (PLDs) connected in a daisy chain arrangement.

* * * * *